(12) United States Patent
Bohnert et al.

(10) Patent No.: US 8,242,402 B2
(45) Date of Patent: Aug. 14, 2012

(54) GAS-INSULATED SWITCHGEAR DEVICE WITH OPTICAL CURRENT SENSOR

(75) Inventors: Klaus Bohnert, Oberrohrdorf (CH); Hubert Braendle, Oberengstringen (CH)

(73) Assignee: ABB Research Ltd, Zurich (CH)

( * ) Notice: Subject to any disclaimer, the term of this patent is extended or adjusted under 35 U.S.C. 154(b) by 165 days.

(21) Appl. No.: 12/819,809

(22) Filed: Jun. 21, 2010

(65) Prior Publication Data
US 2011/0147346 A1 Jun. 23, 2011

Related U.S. Application Data

(63) Continuation of application No. PCT/EP2007/064411, filed on Dec. 21, 2007.

(51) Int. Cl.
*H01H 33/00* (2006.01)
(52) U.S. Cl. ............................ 218/46; 361/93.1; 361/612
(58) Field of Classification Search .................. 218/46; 361/612, 93.1
See application file for complete search history.

(56) References Cited

U.S. PATENT DOCUMENTS

| | | | |
|---|---|---|---|
| 3,810,013 A | 5/1974 | Müller | |
| 4,269,483 A | 5/1981 | Feldtkeller | |
| 4,929,830 A | 5/1990 | Bohnert et al. | |
| 4,939,447 A | 7/1990 | Bohnert et al. | |
| 5,136,236 A | 8/1992 | Bohnert et al. | |
| 5,432,438 A | 7/1995 | Baumgartner et al. | |
| 5,892,357 A * | 4/1999 | Woods et al. | 324/96 |
| 5,936,395 A | 8/1999 | Kevorkian et al. | |
| 6,097,867 A | 8/2000 | Brueck et al. | |
| 6,134,101 A * | 10/2000 | Bucher et al. | 361/612 |
| 6,134,356 A | 10/2000 | Monte | |
| 6,348,786 B1 | 2/2002 | Bjarme et al. | |
| 6,850,399 B1 * | 2/2005 | Kato et al. | 361/93.1 |
| 7,450,792 B2 * | 11/2008 | Bohnert et al. | 385/13 |
| 2005/0088662 A1 | 4/2005 | Bohnert et al. | |
| 2006/0082356 A1 | 4/2006 | Zhang et al. | |
| 2007/0052971 A1 | 3/2007 | Bohnert et al. | |
| 2008/0303510 A1 | 12/2008 | Blake et al. | |

FOREIGN PATENT DOCUMENTS

| | | |
|---|---|---|
| DE | 40 25 911 A1 | 4/1991 |
| EP | 0 316 619 A1 | 5/1989 |
| EP | 0 316 635 A1 | 5/1989 |
| EP | 0 522 303 A2 | 1/1993 |
| EP | 0 682 261 A2 | 11/1995 |

(Continued)

OTHER PUBLICATIONS

K. Bohnert et al., "Temperature and vibration insensitive fiber-optic current sensor", Journal of Lightwave Technology, Feb. 2002, pp. 267-276, vol. 20, No. 2.

(Continued)

*Primary Examiner* — Truc Nguyen
(74) *Attorney, Agent, or Firm* — Buchanan Ingersoll & Rooney PC

(57) ABSTRACT

An exemplary gas-insulated switchgear device is disclosed which includes a current sensor and a voltage sensor located at a partition insulator. The current sensor can include a magneto-optical fiber on a flexible carrier strip and can be manufactured separately for being easily mounted to an assembled switchgear device. The current sensor can include an electro-optical fiber extending radially into the partition insulator and whose ends are embedded in recesses in the bus bar as well as in the metal embracing of the partition insulator for accurately integrating the voltage.

20 Claims, 7 Drawing Sheets

FOREIGN PATENT DOCUMENTS

| EP | 1 512 981 A1 | 3/2005 |
|---|---|---|
| EP | 1 710 589 A1 | 10/2006 |
| WO | WO 2005/111633 A1 | 11/2005 |

OTHER PUBLICATIONS

K. Bohnert et al., "Highly accurate fiber-optic dc current sensor for the electro-winning industry", IEEE/IAS Transactions on Industry Applications, Jan./Feb. 2007, pp. 180-187, vol. 43, No. 1.

R. Laming et al., "Electric current sensors employing spun highly birefringent optical fibers", Journal of Lightwave Technology, Dec. 1989, vol. 7, No. 12, pp. 2084-2094.

G.A. Massey et al., "Electromagnetic Field Components: Their Measurement Using Linear Electrooptic and Magnetooptic Effects," Applied Optics, Nov. 1975, pp. 2712-2719, vol. 14, No. 11.

P.G. Kazansky et al., "Glass Fiber Poling and Applications," J. of Lightwave Technology, Aug. 1997, pp. 1484-1493, vol. 15, No. 8.

W.J. Bock et al., "Temperature-hydrostatic pressure cross-sensitivity effect in elliptical-core, highly birefringent fibers", Applied Optics, Nov. 1996, pp. 6267-6270, vol. 35, No. 31.

D.A. Jackson et al., "Elimination of drift in a single-mode optical fiber interferometer using a piezoelectrically stretched coiled fiber", Applied Optics, Sep. 1980, pp. 2926-2929, vol. 19, No. 17.

J. Noda et al., "Polarization-maintaining fibers and their applications", Journal of Lighwave Technology, Aug. 1986, pp. 1071-1089, vol. Lt-4, No. 8.

P. Blazkiewicz et al., "Modification of Thermal Poling Evolution Using Novel Twin-Hole Fibers", Journal of Lightwave Technology, Aug. 2001, pp. 1149-1154, vol. 19, No. 8.

T.A. Birks et al., "Endlessly single-mode photonic crystal fiber", Optics Letters, Jul. 1, 1997, pp. 961-963, vol. 22, No. 13.

A. Kaczkowski, "Combined Sensors for Current and Voltage are Ready for Application in GIS", CIGRE-CE/SC:12, Session paper, Ref. No. 12-106, 1998, 7 pages.

Notification Concerning Transmittal of International Preliminary Report on Patentability (Forms PCT/IB/326 and PCT/IB/373) and the Written Opinion of the International Searching Authority (Form PCT/ISA/237) issued in corresponding International Application No. PCT/EP2007/064411 dated Jul. 1, 2010.

* cited by examiner

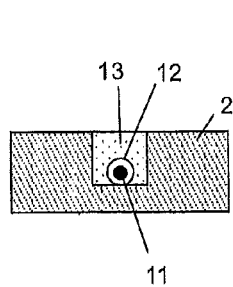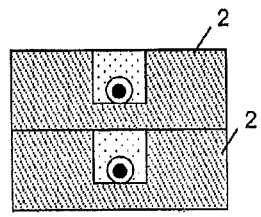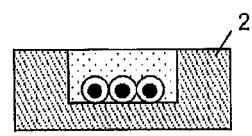
Fig. 3          Fig. 4          Fig. 5
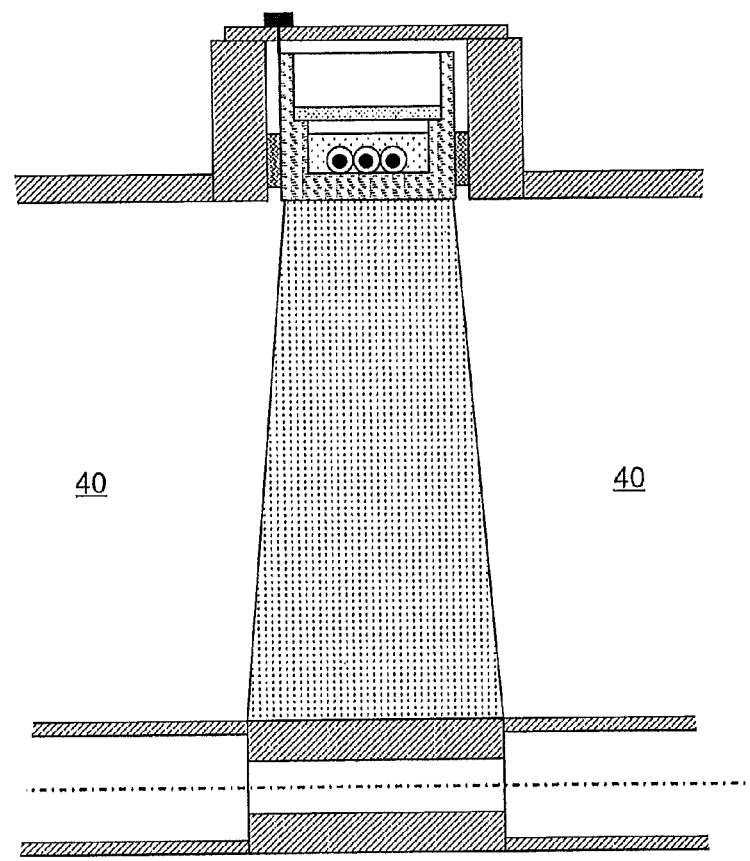
Fig. 6

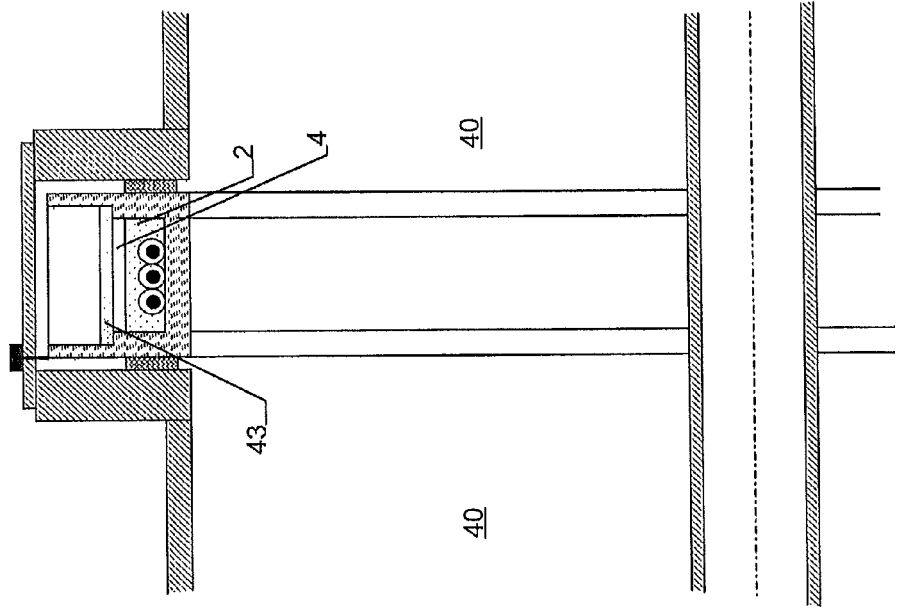
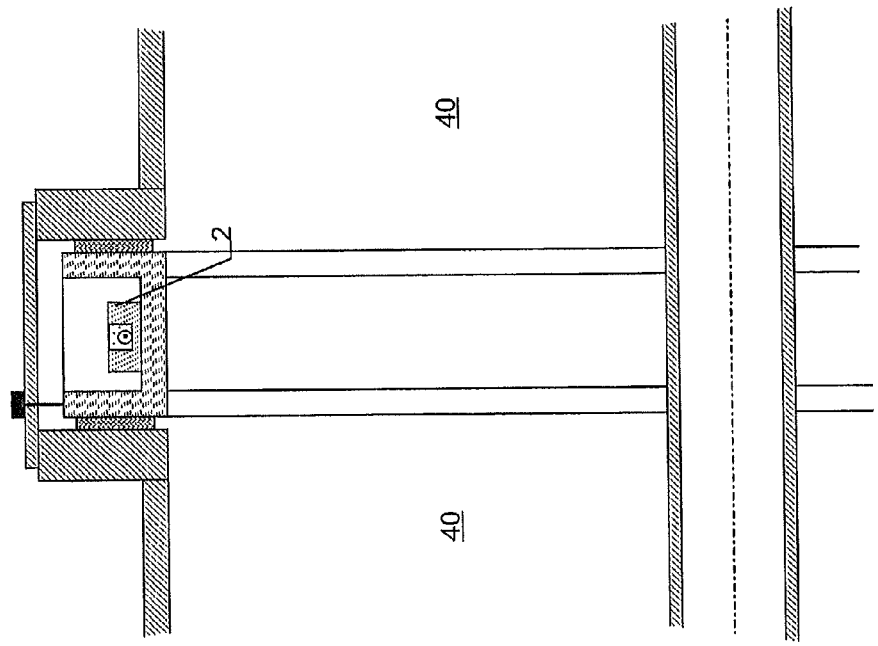

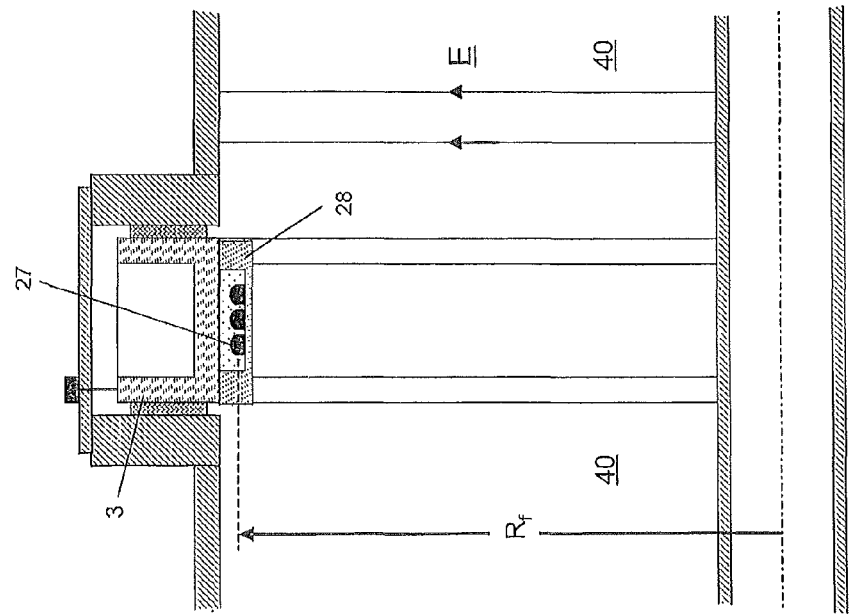
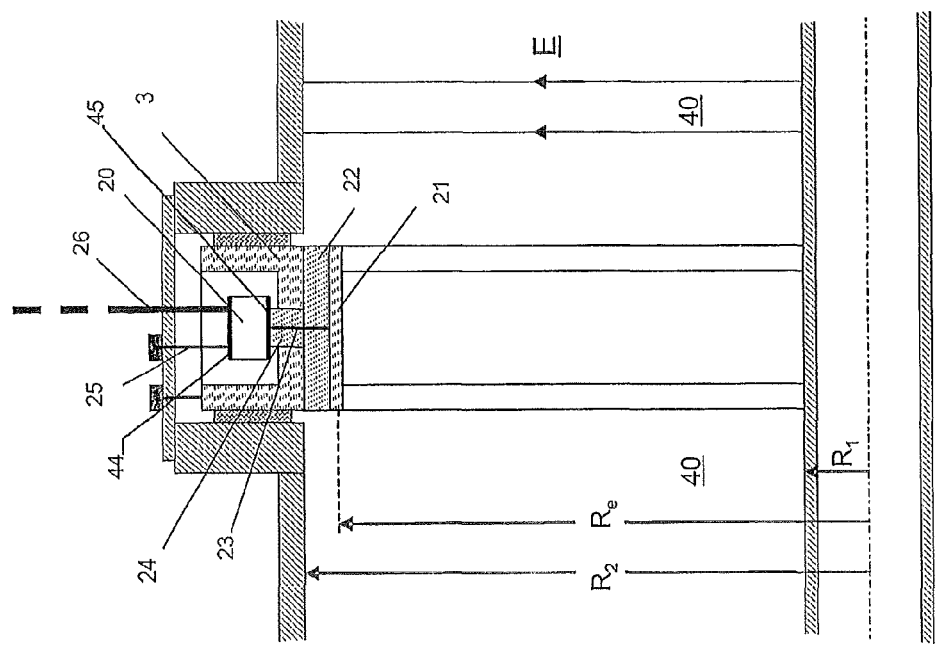
Fig. 9
Fig. 10

US 8,242,402 B2

GAS-INSULATED SWITCHGEAR DEVICE WITH OPTICAL CURRENT SENSOR

RELATED APPLICATION

This application claims priority as a continuation application under 35 U.S.C. §120 to PCT/EP2007/064411 filed as an International Application on Dec. 21, 2007 designating the U.S., the entire content of which is hereby incorporated by reference in its entirety.

FIELD

The disclosure relates to a gas-insulated high-voltage switchgear device with an optical current sensor.

BACKGROUND INFORMATION

Known current and voltage transformers for gas-insulated switchgear (GIS) are, for example, based on electro-magnetic induction. These transformers are heavy and voluminous modules and are integral components of a GIS system. The current transformer may be mounted between a disconnector/earthing switch and the circuit breaker. The voltage transformer may be mounted on the opposite side of the disconnector/earthing switch near the bushing. The significant size of the transformers is in contrast to a main goal of GIS (i.e. overall compactness and space savings).

In recent years, more compact electronic and optical sensors have been disclosed. DE 4025911 A1 describes a compact arrangement of optical voltage and current sensors for single-phase encapsulated GIS. The voltage is measured via the piezoelectric effect in disk-shaped quartz crystals positioned on the inside of a metal ring. The pre-assembled sensor module is mounted between two GIS compartments and forms a part of the GIS encapsulation. The piezoelectric deformations of the quartz caused by the electric field around the bus bar are detected with an optical fiber. The module may also contain a mechanical support for an optical fiber coil for magneto-optic current measurement (Faraday effect). The fiber coil may be placed inside or outside the GIS gas compartment (i.e. the gas-filled chamber). Such arrangements include gastight fiber feed-through(s) from the GIS chamber to the outside and involve protection of the fiber against aggressive decomposition products of $SF_6$ produced in electric arcs.

Ref. 1 describes a compact module with combined electronic current and voltage sensors. Here, the current is measured with a Rogowski coil and the voltage is measured with a capacitive divider. The module is again mounted between two GIS compartments.

EP 1710589 A1 discloses a further arrangement of optical current and voltage sensors. Here, the mechanical support structure includes two ring-shaped parts (one electrically conductive, the other non-conductive) which are also mounted between two GIS compartments and again are part of the GIS encapsulation. Between the ring-shaped parts is a groove to accommodate an optical fiber for current sensing. The non-metallic part has a dead end bore (accessible from the outside) that houses a Pockels cell for optical voltage measurement. Again, temperature dependent changes in the dimensions and in dielectric constants may affect the voltage measurement.

The approaches above have in common that retrofit or module exchange is not possible without taking the switchgear from the line and at least partially dismantling it.

WO 2005/111633 discloses a concept for stress-free packaging and orientation of the sensing fiber of a fiber-optic current sensor (e.g., for the precise measurement of high direct currents at aluminum smelters).

U.S. Pat. No. 6,348,786 and U.S. Pat. No. 5,936,395 disclose optical voltage sensors based on electrically poled fibers.

EP 522 303 describes current and voltage sensor comprising a toroidally wound coil for the current measurement as well as a hollow cylindrical sensing electrode for the voltage measurement.

SUMMARY

A gas-insulated switchgear device is disclosed in an enclosure; a chamber arranged in said enclosure, and filled by an insulating gas or vacuum; at least one bus bar arranged in said chamber for carrying an electrical current; and at least one fiber loop of a magneto-optical fiber wound around said at least one bus bar at a distance from said at least one bus bar for measuring electrical current through said bus bar; a loop-shaped, flexible carrier strip carrying said fiber; and a shield wall separate from said carrier strip and arranged between said carrier strip and said chamber.

BRIEF DESCRIPTION OF THE DRAWINGS

Further embodiments, advantages and applications of the disclosure are disclosed in the following description, which makes reference to the figures. These show:

FIG. 3 a sectional view of an exemplary carrier strip with embedded fiber;

FIG. 4 a sectional view of an exemplary multiple-winding arrangement of a carrier strip with embedded fiber;

FIG. 5 a sectional view of an exemplary carrier strip with several windings of an embedded fiber;

FIG. 6 a sectional view of a third exemplary embodiment of a GIS (upper half only) with current sensor;

FIG. 7 a sectional view of a fourth exemplary embodiment of a GIS (upper half only) with current sensor;

FIG. 8 a sectional view of a fifth exemplary embodiment of a GIS (upper half only) with current sensor;

FIG. 9 a sectional view of a sixth exemplary embodiment of a GIS (upper half only) with voltage sensor;

FIG. 10 a sectional view of a seventh exemplary embodiment of a GIS (upper half only) with voltage sensor;

DETAILED DESCRIPTION

A gas-insulated switchgear device is disclosed with a current sensor that yields accurate current measurements while being easy to assemble.

In an exemplary embodiment, a magneto-optic fiber is wound at least once around the bus bar at a distance therefrom. The fiber is carried by a flexible carrier strip, and a shield wall separate from the carrier strip is arranged between the carrier strip and the chamber.

This design allows the fiber to be located outside the chamber, which obviates the need for gastight fiber feed-throughs. At the same time, a sensing assembly which includes the fiber and its carrier strip can be manufactured and calibrated separately from the rest of the switchgear and can be mounted to the switchgear without disassembly of the switchgear. This can simplify installation, maintenance and/or retrofitting.

DEFINITIONS

The following definitions are used in the present text and claims:

The direction "axial" designates the longitudinal axis of the bus bar in a region of the voltage and/or current sensor.

The direction "radial" designates any direction perpendicular to the axial direction.

The term "flexible carrier strip" refers to a carrier strip that can be non-destructively bent from a stretched configuration to a radius corresponding to a radius of the enclosure of a GIS, (e.g., to a radius of approximately 20 cm or larger).

Figure 1:
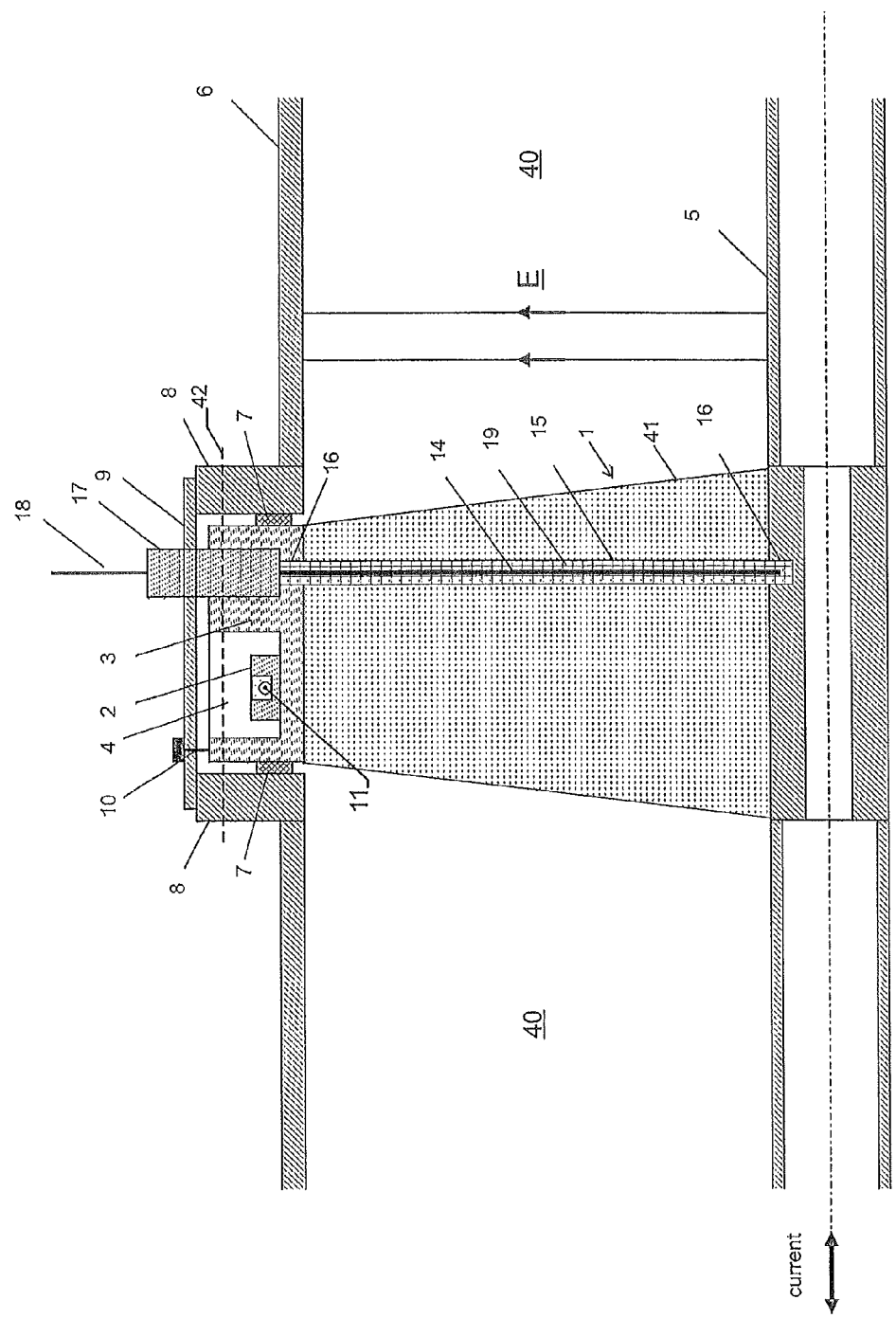
FIG. 1 a sectional view of a first exemplary embodiment of a GIS (upper half only), with current and voltage sensor.

Current Sensor Arrangements:

FIG. 1 shows a sectional view of a first exemplary embodiment of a gas-insulated switchgear. It comprises an enclosure 6 enclosing a chamber 40 filled with an insulating gas, such as $SF_6$, or vacuum. The enclosure 6 can, for example, be arranged cylindrically and concentrically around a bus bar 5 carrying the current through the switchgear. Chamber 40 is divided into a plurality of partitions axially separated by partition insulators 1. Each partition insulator 1 comprises a partition wall 41 extending from the enclosure 6 to the bus bar 5. Partition wall 41 is surrounded by a metal embracing 3.

In a first exemplary embodiment, at least one partition insulator 1 of the GIS is modified such that it accommodates an optical current sensor and/or an optical voltage sensor. The current sensor makes use of the magneto-optic effect (Faraday effect) in an optical fiber 11. An exemplary sensor version is an interferometric sensor as described in Ref. 2, 3 and WO 2005/11633. The magnetic field of the current produces a differential phase shift of left and right circularly polarized light waves propagating in a sensing fiber 11. The phase shift is detected (e.g., by a technique as known from fiber gyroscopes). The disclosure is not restricted to interferometric fiber-optic current sensors, however, but may be used as well for others, such as polarimetric, sensors. In a polarimetric sensor the magneto-optic effect is detected as a rotation of a linearly polarized light wave.

The sensing fiber 11 is packaged in a flexible carrier strip 2 (e.g., substantially rectangular and/or of fiber re-enforced epoxy resin, as disclosed in WO 2005/111633). A sectional view of a carrier strip comprising an embedded fiber 11 is shown in FIG. 3.

Metal embracing 3 of the partition insulator 1 forms a shield wall, separate from carrier strip 2, arranged between carrier strip 2 and chamber 40. In other words, carrier strip 2 is arranged outside chamber 40 (e.g., under normal atmosphere). Metal embracing 3 is arranged radially outside partition wall 41 and is connected thereto.

Metal embracing 3 has a groove or recess 4 on its radially outward facing side to accommodate one or several loops of the flexible carrier strip (see FIGS. 3-5).

In exemplary embodiments, there is no current flow through metal embracing 3, since the current sensor should only measure the current in the bus bar 5, but not be affected by any current in the GIS enclosure 6. The embracing 3, which is arranged axially between two neighboring tube sections of enclosure 6, is therefore electrically isolated from one or both of tube sections by means of one or more non-conductive seals 7. The seals 7 can also prevent leakage of gas (commonly pressurized $SF_6$ gas) from the gas-filled chamber 40 of the switchgear.

The flanges 8 of the adjacent tube sections of enclosure 6 are held together by bolts and screws (the location of one of which is shown in a dashed line under reference number 42 in FIG. 1). The bolts penetrate the metal embracing 3 on, for example, the radial outside of the sensing carrier strip 2. Any current through the bolts will then not disturb the current measurement. If the bolts penetrate the metal embracing 3 on the radial inside of the carrier strip 2, they should be electrically isolated from at least one of the flanges 8 in order to prevent current from flowing through the bolts. Current flowing in the enclosure 6 is guided around the carrier strip through a conductive part 9 electrically connecting the flanges 8. Part 9 is arranged radially outside the fiber loop of the carrier strip, again in order to prevent its current from being measured. A conducting connection 10 between the metal embracing 3 and the part 9 or the GIS enclosure 6 ascertains that the metal embracing 3 is on the same electric potential as the enclosure 6 (ground potential).

The sensing fiber 11 can be a single-mode fused silica fiber with low intrinsic birefringence. The bare fiber (without coating) is accommodated in a thin fused silica capillary 12 as shown in FIG. 3 and as described in EP 1 512 981, the disclosure of which is herewith incorporated by reference. The capillary 12 can be coated for protection (e.g., with a thin polyimide coating) and can be filled with a lubricant to avoid friction between the fiber and the capillary walls. The capillary is embedded in silicone or a resin in a groove 13 of the carrier strip 2. The groove 13 may be, for example, of rectangular or triangular shape. For example, the longitudinal capillary axis is in the neutral plane of the carrier strip (at half the thickness of the strip) so that bending the strip 2 does not strain the capillary 12.

This way of fiber packaging avoids any packaging related stress on the fiber over a wide range of temperatures, which is crucial for high stability and measurement accuracy of the sensor. The carrier strip 2 serves as a robust mechanical protection of the capillary 12 and also ascertains a reproducible azimuth angle of the fiber, a further exemplary feature for high scale factor repeatability. (See WO 2005/111633, the disclosure of which is herewith incorporated by reference in its entirety.)

Figure 12:
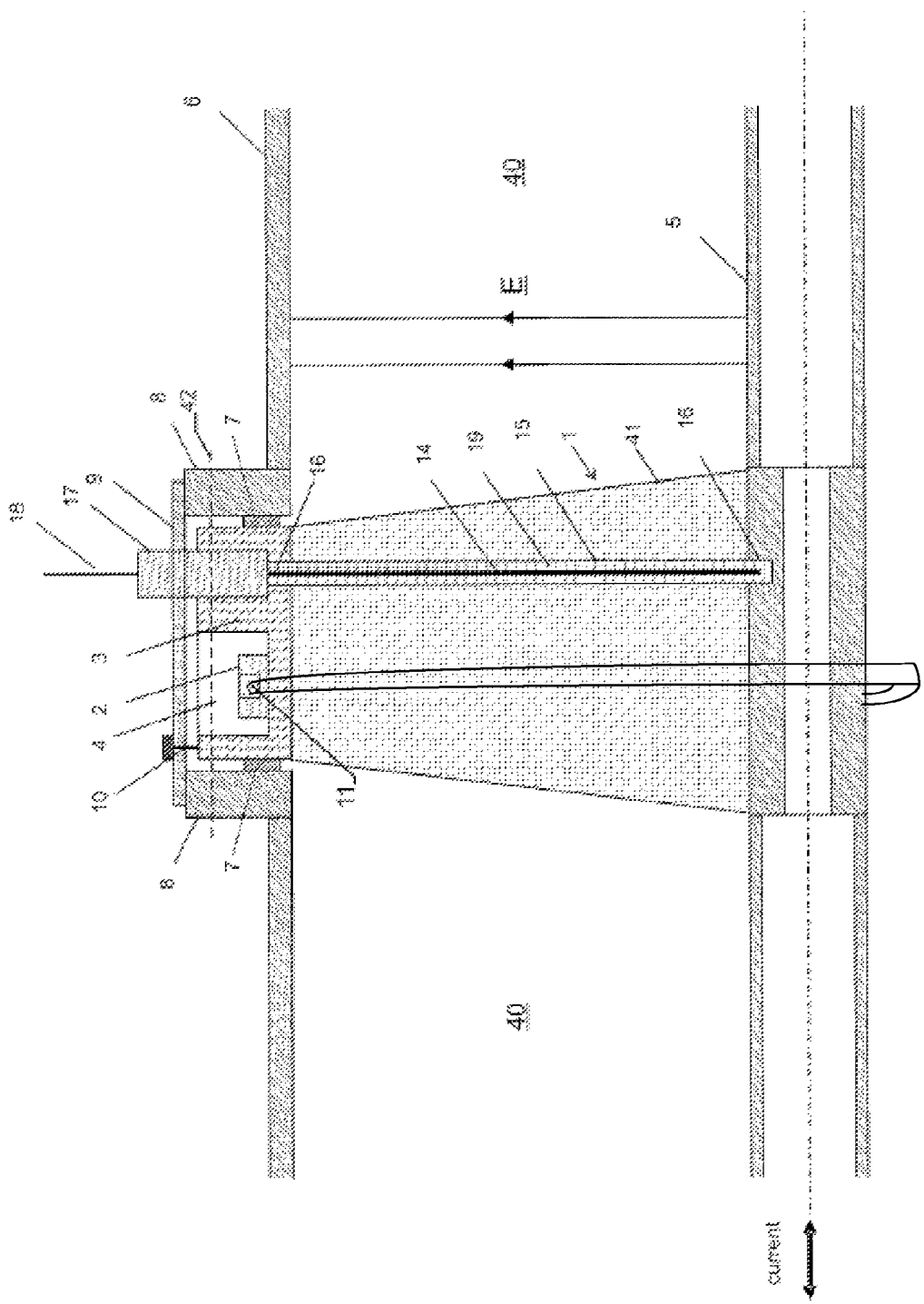
FIG. 12 a sectional view of a first exemplary embodiment of a GIS (upper half only), with current and voltage sensor.

The fiber 11 forms an integer number of loops around bus bar 5 (see FIG. 12) to ascertain that the sensor measures a closed path integral of the magnetic field. The signal is thus independent of the magnetic field distribution and unaffected by currents flowing radially outside the fiber loops. The sensing fiber length therefore corresponds to an integer multiple of the circumference of the partition insulator 1. In order to properly close the carrier strip 2, the carrier strip 2 carries markers separated by the length of the sensing fiber. For example, the markers are at or near the fiber ends. The carrier strip 2 is mounted in the groove or recess 4 of the partition insulator 1 in such as way that the markers coincide (e.g., that they are at the same tangential position). A clamp can be used to keep the overlapping strip sections in place. Instead of markers or in addition to markers there may be boreholes through the strip 2 (in FIG. 1 in a radial direction), separated by a loop circumference. The fiber coil is then closed by bringing the bore holes to coincide. A pin through these holes and mechanical fixtures may be used to keep the arrangement in place.

At high rated currents one fiber loop may be already sufficient. If more loops are desired, the carrier strip 2 may be mounted in two or more superposed loops as shown in FIG. 4.

With exemplary embodiments, the GIS and the sensor can be fully assembled independent of each other. The sensor can be easily added to and removed from the assembled GIS.

Provided the GIS has been assembled with an appropriately modified partition insulator, a later retrofit of a sensor is possible without any dismantling of the switchgear. The calibration of the sensor can be done without the partition insulator being available at the time of calibration.

Alternatively, the sensor may have only one loop of carrier strip containing several capillary loops with the fiber 11 inside, as shown in FIG. 5. In this case the carrier strip is mounted first in the groove or recess 4 of the partition insulator 1. Subsequently, the capillary loops are wrapped into the groove of the strip. Here, it can be ascertained that the sensing fiber length is an integer multiple of the perimeter length of the carrier strip. For practical reasons, the sensor can be added to the partition insulator 1 before the partition insulator 1 is installed at GIS. Sensor calibration can, for example, be done with the fiber mounted on the insulator. Alternatively, the partition insulator may be designed such that the carrier strip including the fiber loops can be prepared and calibrated independent of the insulator. For this purpose, the metal embracing of the partition insulator 1 may be divided into two parts so that the carrier strip can be slid on one of the parts from the side and the second part attached subsequently.

Instead of a fiber with low intrinsic birefringence, the fiber may be a highly birefringent spun fiber as known from Ref. 4. This type of fiber is more stress tolerant and therefore may be embedded into the epoxy strip or metal embracing (FIGS. 1-5) without a capillary, and without a removal of the coating.

FIGS. 6-8 show further exemplary alternatives for the current sensor arrangement. In FIG. 6, the capillary with the sensing fiber is embedded into a recess of the metal embracing of the partition insulator. In this case a carrier strip is not needed. FIG. 7 shows an exemplary arrangement where the carrier strip is mounted in a metal embracing without a partition insulator. FIG. 8 shows an exemplary embodiment without a carrier strip and without a partition insulator. The capillary alone is mounted in a recess or groove 4 of the metal embracing and embedded for example in silicone. A lid 43 closes the groove or recess and protects the capillary.

It should be noted that the sensor described here can also be mounted at a position separate from a partition insulator (e.g., instead of a partition insulator an independent mount without an insulator can be used). This is illustrated in the embodiments of FIGS. 6-8. The mount is essentially equivalent to the metal embracing of a partition insulator and again installed between two GIS modules, (e.g., between two tube-shaped sections of enclosure 6).

Voltage Sensor Arrangements:

The partition insulator of FIG. 1 contains, apart from the current sensor, a voltage sensor that measures the voltage between the bus bar 5 and the enclosure 6. The voltage sensor is arranged within the partition wall 41.

In the exemplary embodiment of FIG. 1, the voltage is measured by an electro-optical voltage sensor performing a line integration of the electric field. An electro-optical voltage sensor is based on measuring electric-field-induced refractive index changes. An electric field applied to the material induces birefringence or changes the birefringence of an intrinsically birefringent material. The voltage sensor of FIG. 1 comprises a light guiding element, such as a crystalline fiber, extending radially inwards from metal embracing 3.

The sensor can utilize the linear electro-optic effect (Pockels effect) in a crystalline, electro-optical fiber or rod 14, for example, of $Bi_4Ge_3O_{12}$ (BGO). Suitable technologies for measuring the voltage using electro-optical fibers are, for example, described in U.S. Pat. No. 4,269,483, the disclosure of which is herewith incorporated by reference in its entirety.

The fiber or rod resides in a radial bore 19 of the insulating partition wall 41 between the bus bar 5 and the metal embracing 3 and is operated in reflection. The radially outer end of fiber or rod 14 extends into a recess 16 in a radially inward facing surface of the shield wall or embracing 3, and the radially inner end of fiber 14 extends into a recess 16 in a radially outward facing surface of bus bar 5. This design can ensure that the line integral of the field along the fiber or rod corresponds to the full electric potential difference between the bus bar and the metal embracing. The recesses 16 have, for example, a large depth-to-diameter-ratio so that the field strength in the recesses is small. As a result small displacements of the fiber or rod 14 have little effect on the signal, even if the fiber ends are not in direct electric contact with the bus bar 5 and the embracing 3. Alternatively, or in addition thereto, the ends of fiber or rod 14 may carry a metal shielding in the form of a metal cap or a conductive layer electrically connected to the bus bar and the embracing, respectively, for example via spring contacts. The fiber or rod 14 can be held in a socket 17 in embracing 3 and be connected to the light source/detection module of the sensor (not shown) by one or several optical feed fibers 18.

Figure 2:
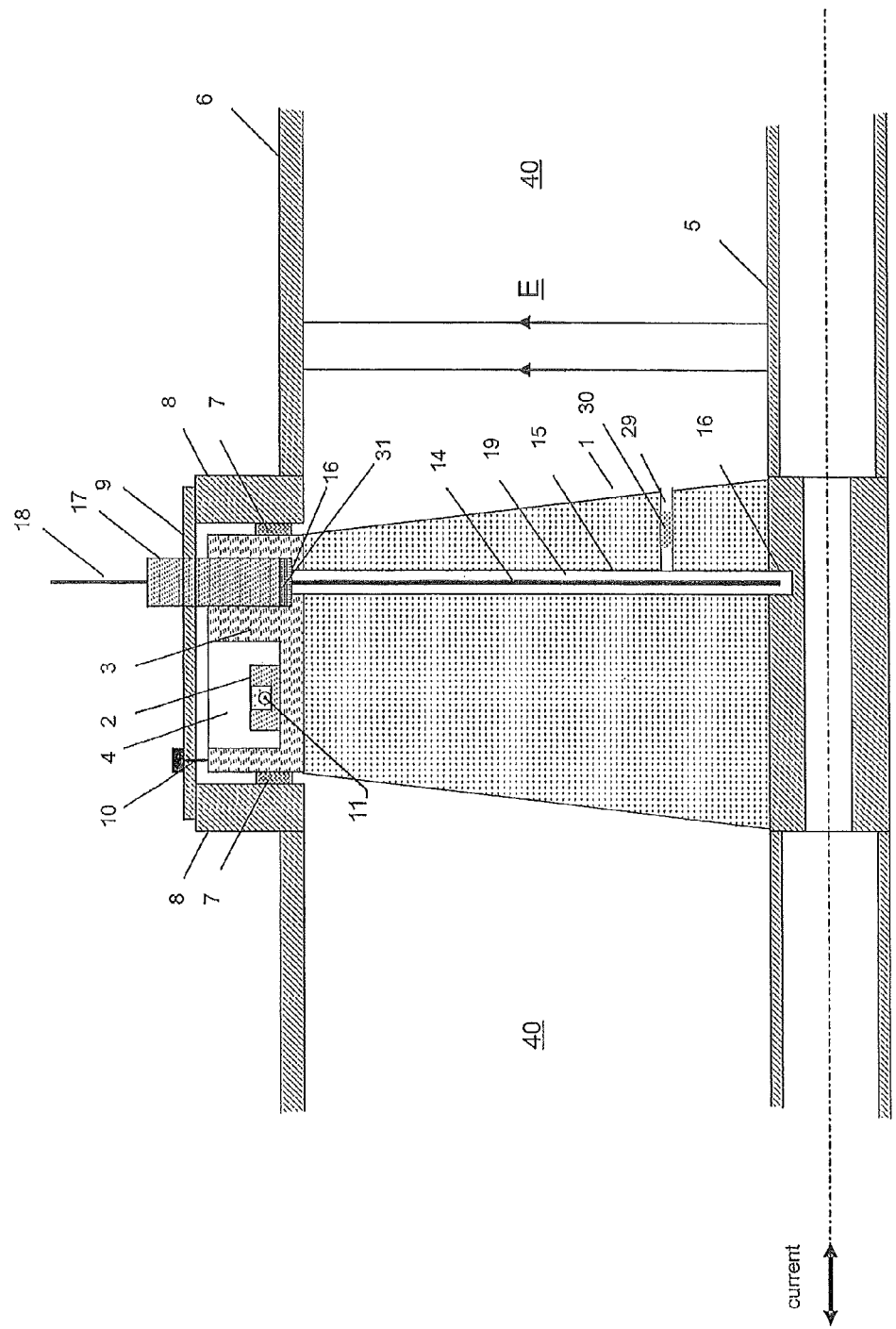
FIG. 2 a sectional view of a second exemplary embodiment of a GIS (upper half only) with current and voltage sensor.

The fiber or rod 14 may reside in a capillary tube made from a dielectric material such as fused silica. The capillary is filled with an insulating fluid (e.g., silicone oil) for electric insulation. As a result, the fiber or rod 14 is not subject to any mechanical stress. The capillary is embedded in a resin or oil 19. In another realization of the disclosure the fiber or rod 14 may be installed without capillary. The bore 15 is again filled with a resin or oil 19. In still another realization the bore 15 is in gas-exchange with a neighboring GIS module, as shown in FIG. 2. Gas exchange takes place through a channel 29. Channel 29 may be filled with a cartridge 30 containing a filter, blocking at least part of the $SF_6$ decomposition products, namely aggressive $SF_6$ decomposition products, such as $SF_4$ or HF. The filter can, for example, comprise a material that acts as a molecular sieve or absorber. These decomposition products may arise in electric arcs during switching. The filter may be made of alkali-aluminium-silicate combined with CaO, e.g. $0.7\ CaO.0.3Na_2O.Al_2O_3.2SiO_2.nH_2O$ (with n=natural number). A seal 31 prevents gas leakage to the outside.

Instead of being operated in reflection, the crystalline fiber or rod may be operated in transmission. This can involve an extra fiber connection to the bus bar end of the crystalline fiber or rod.

Instead of an electro-optic sensor, the bore 15 may contain the sensitive part of a piezo-optic sensor as known from EP 0 316 635, the disclosure of which is hereby incorporated by reference in its entirety. Here the piezoelectric deformation of piezoelectric transducer elements is transmitted to an optical fiber. The induced fiber strain produces a phase shift of light waves propagating in the fiber proportional to the voltage.

FIG. 9 shows a voltage sensor combining a capacitive divider with an optical sensing element 20 carrying two electrodes 44, 45 arranged radially outside the metal embracing 3. The divider is formed by the metal embracing 3 as in the previous embodiments and a concentric ring-shaped inner electrode ring 21 separated by at least one dielectric spacer layer 22 or several individual spacer elements. Electrode ring 21 is arranged radially inside metal embracing 3 and extends at least partially around bus bar 5 at a distance from bus bar 5. One electrode 44 of the sensing element 20 is connected to the encasing 3 (ground), while the other electrode 45 of the sensing element 20 is connected to electrode ring 21. The voltage between the metal embracing and the electrode ring 21 is given by $V_0[1-\ln(R_e/R_1)/\ln(R_2/R_1)]$ where $R_1$, $R_2$, $R_e$ are the radii of the GIS bus bar, the GIS enclosure and the ring electrode, respectively. $V_O$ is the voltage to be measured between the bus bar and the enclosure. The electrode ring 21 is in electric contact with the sensitive part of an optical voltage sensor 20 via a connecting wire 23. The wire 23 is insulated from the metal embracing 3 by an insulation layer 24. Ground potential is supplied to the voltage sensor via a connecting wire 25. The voltage sensor may be, for example, an electro-optic sensor as known from EP 0 682 261 or Ref. 5 or a piezo-optic sensor as known from EP 0 316 619, the disclosures of which are herewith incorporated by reference in their entireties. The source, detection, and signal processing components of the voltage sensor are, for example, placed separately from the GIS and connected to the optical sensing element 20 by one or several fiber cables 26.

The voltage sensor of FIGS. 9 and 10 may again be combined with a current sensor as described above.

Voltage Sensor Using Electrically Poled Optical Fiber:

A common glass fiber does not exhibit a linear electro-optic effect. It has been shown, however, that the anisotropy produced by electric poling of the fiber does result in a linear electro-optic effect (Pockels effect) [e.g. Ref. 6]. The poling direction can be transverse to the longitudinal fiber axis. The fiber is then sensitive to transverse electric fields. Voltage sensors based on poled fiber have been disclosed in U.S. Pat. Nos. 6,348,786 and 5,936,395.

In the exemplary embodiment of FIG. 10, a transversally poled fiber 27 (or some other poled light guiding element) is looped at least once (but can be more than once) around bus bar 5.

In GIS the electric field distribution is well defined and stable so that field integration is not necessarily needed for accurate voltage measurement. FIG. 10 shows an arrangement of a transversally poled fiber for voltage measurement at GIS. The fiber 27 is wound on a ring-shaped mount 28 on the radially inner side of metal embracing 3 and concentric to the embracing. The mount 28 is made of a dielectric material, such as fiber re-enforced epoxy, so that it does not screen the electric field from the fiber windings. The fiber windings may be embedded in silicone or an epoxy resin. The electric field strength at the location of fiber windings is given by $E(R_f) = V_O / [R_f \ln(R_2/R_1)]$ where $R_f$ is the radius of the fiber windings (neglecting the small influences of the dielectric mount on the field). The field at the fiber windings is thus proportional to the GIS voltage $V_O$.

Figure 11:
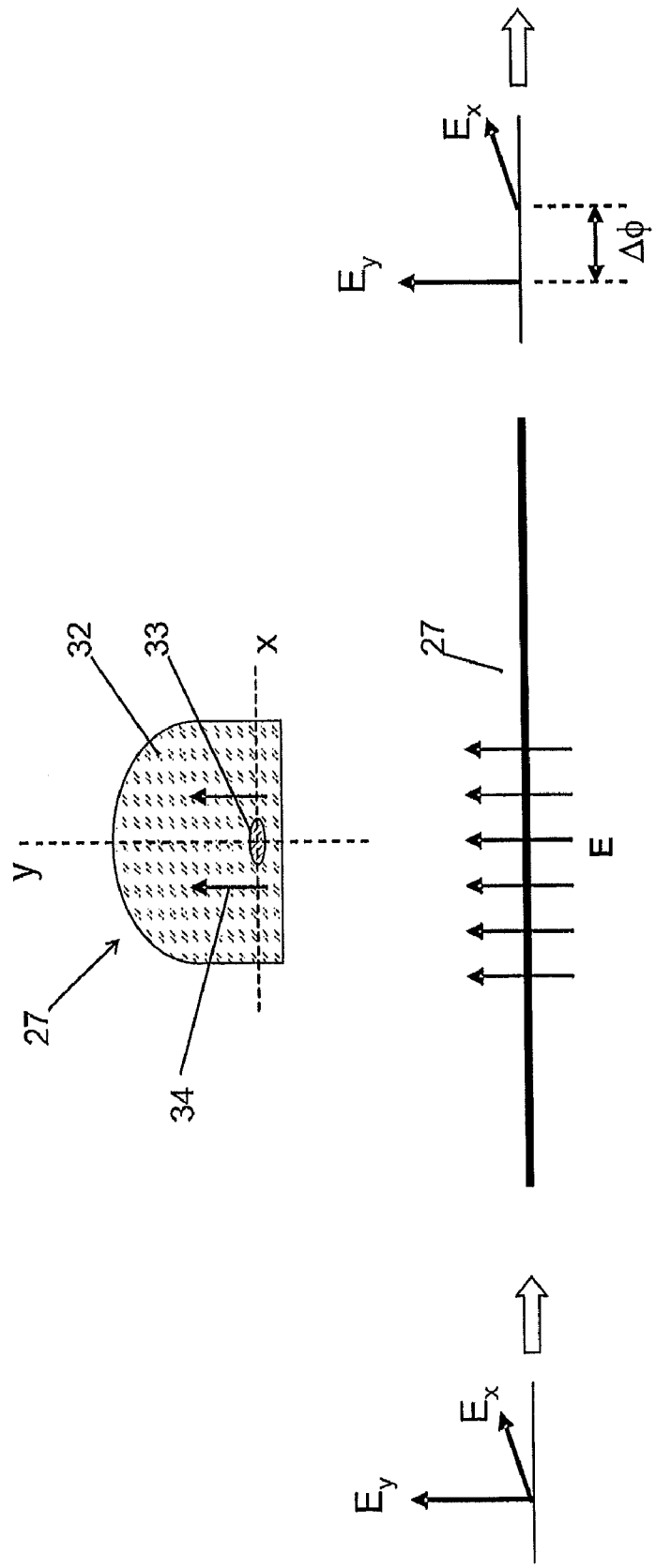
FIG. 11 a sectional view of an exemplary poled fiber.

The fiber is, for example, a polarization maintaining (pm) fiber with an elliptical core 33 as shown in FIG. 11. It has a D-shaped cladding 32. The D-shape makes it possible to wrap the fiber onto the mount 28 with a defined orientation of the poling direction 34 and the core 33. The D-shape also allows efficient fiber poling, see Ref. 6 and U.S. Pat. No. 6,097,867. The flat cladding surface is in contact with the surface of mount 28. The poling direction is perpendicular to the flat cladding surface and thus parallel to the electric field. The major and minor axes, x and y, of the elliptical fiber core 33 (slow and fast axes of birefringence) are parallel and perpendicular to the flat cladding surface. In order to measure the electric field, two light waves $E_x$ and $E_y$ with orthogonal polarization directions are launched into the fiber (FIG. 11). The electric field introduces a differential phase shift between the two waves given by $\Delta\phi = (2\pi/\lambda) \cdot (\Delta n_x - \Delta n_y) \cdot L$. Here, $\lambda$ is the optical wavelength and $\Delta n_x$, $\Delta n_y$ are the electro-optic changes in the indices of refraction $n_x$, $n_y$ for the two polarizations, given by $\Delta n_x = (\frac{1}{2}) \cdot r_{13} \cdot n_x^3 \cdot E_{eff}$ and $\Delta n_y = (\frac{1}{2}) \cdot r_{33} \cdot n_y^3 \cdot E_{eff}$. The electro-optic coefficients $r_{13}$, $r_{33}$ are related to each other by the relationship $r_{33} = 3 r_{13}$. $E_{eff}$ is the effective field strength at the fiber core. L is the fiber length exposed to the electric field.

For a stable geometry and field distribution the optical phase shift $\Delta\phi$ is a measure for the voltage $V_O$. Small changes in the field strength $E_{eff}$ as a result of thermal expansion and thermal variations in the dielectric constants of the mount and fiber may be compensated by a temperature measurement. The influence of thermal expansion may be reduced by a mount 28 comprising carbon fiber (e.g., by consisting of a carbon fiber reinforced plastic or having an extra embedded support made of carbon fiber reinforced plastic).

The phase shift $\Delta\phi$ can be measured by means known to those skilled in the art. It can also be measured by using a technique as known from fiber gyroscopes with adaptations. This technique can involve an extra fiber for compensation of the differential group delay of two orthogonal waves and of thermal changes in the phase difference. The extra fiber may be a section of un-poled pm fiber (for example, of the same type as the poled fiber) with an appropriately chosen length. The poled and un-poled fiber sections are spliced together with a 90°-offset in the orientation of the core axes so that the thermal phase shifts in the two fibers have opposite sign and cancel each other. The un-poled fiber may be wrapped on the same mount 28 as the poled fiber or on an extra support outside the electric field. The extra support should have sufficient thermal contact to the GIS enclosure in order to keep the temperature difference between the two fiber sections small. If the compensating fiber is placed out of the electric field, it may also be a section of poled fiber.

Instead of a fiber gyroscope based detection technique, a polarimetric concept may be used as known, for example, from Ref. 7. The technique involves a phase modulator, such as at the compensation fiber, as part of a control loop that keeps the bias phase shift at quadrature for maximum sensitivity, Ref. 8.

The poled fiber may be spliced together from several individual sections of poled fiber in order to realize a sufficient overall length if desired.

Instead of a D-shaped fiber, other fiber shapes, as described for example in U.S. Pat. Nos. 6,097,867 and 6,134,356, may be used which make simple fiber orientation possible. Instead of an elliptical-core fiber, other types of polarization-maintaining fiber as known from Ref. 9, such as Panda fiber, may be employed. An advantage of elliptical-core fiber is its relatively small variation of the differential phase with temperature. The fiber may also be a poled side-hole (twin-hole) fiber, Ref. 10, or a micro-structured fiber (holey or photonic crystal fiber, Ref. 11).

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

1. Andrzej Kaczkowski. "Combined sensors for current and voltage are ready for application in GIS", CIGRE-CE/SC: 12. Session paper. Ref. No: 12-106, 1998.
2. "Temperature and vibration insensitive fiber-optic current sensor", K. Bohnert, G. Gabus, J. Nehring, and H. Brändle, J. of Lightwave Technology 20(2), 267-276 (2002).
3. "Highly accurate fiber-optic dc current sensor for the electro-winning industry", K. Bohnert, H. Brändle, M. Brunzel, P. Gabus, and P. Guggenbach, IEEE/IAS Transactions on Industry Applications 43(1), 180-187, 2007.

4. R. I. Laming and D. N. Payne, "Electric current sensors employing spun highly birefringent optical fibers", J. Lightw. Technol., 7, no. 12, 2084-2094, 1989.
5. G. A. Massey, D. C. Erickson, and R. A. Kadlec, "Electromagnetic Field Components: Their Measurement Using Linear Electrooptic and Magnetooptic Effects," Appl. Opt. 14, 2712 (1975).
6. P. G. Kazansky, P. St. J. Russell, and H. Takebe, J. Lightw. Technol. 15(8), 1484-1493, 1997.
7. W. J. Bock and W. Urbanczyk, "Temperature-hydrostatic pressure cross-sensitivity effect in elliptical-core, highly birefringent fibers", Applied Optics 35(31), 62676270, 1996.
8. D. A. Jackson, R. Priest, A. Dandridge, and A. B. Tveten, "Elimination of drift in a single-mode optical fiber interferometer using a piezoelectrically stretched coiled fiber", Appl. Opt., vol. 19, pp 2926-2929, 1980.
9. J. Noda, K. Okamoto, and Y. Sasaki, "Polarization-maintaining fibers and their applications", J. Lightw. Technol. 4, 1071-1089, 1986.
10. P. Blazkiewicz, W. Xu, D. Wong, S. Fleming, and T. Ryan, J. Lightw. Technol. 19(8), 1149-1154, 2001.
11. T. A. Birks, J. C. Knight, and P. St. J. Russell, "Endlessly single-mode photonic crystal fiber", Optics Letters 22(13), 961-963, 1997.

LIST OF REFERENCE NUMBERS

1: partition insulator
2: carrier strip
3: metal embracing and shield wall
4: recess
5: bus bar
6: enclosure
7: seals
8: flanges
9: conductive part
10: conductive connection
11: magneto-optical fiber
12: capillary
13: groove
14: electro-optical fiber or rod
15: radial bore
16: recesses
17: socket
18: optical feed fibers
19: resin or oil
20: optical voltage sensing element
21: inner electrode ring
22: dielectric spacer layer
23: connecting wire
24: insulation layer
25: connecting wire
26: fiber cables
27: transversely poled fiber
28: mount
29: channel
30: filter
31: seal
32: cladding
33: core
34: poling direction
40: chamber
41: partition wall
42: screw or bolt location
43: lid
44, 45: electrodes

What is claimed is:

1. A gas-insulated switchgear device, comprising:
an enclosure;
a chamber arranged in said enclosure, and filled by an insulating gas or vacuum;
at least one bus bar arranged in said chamber for carrying an electrical current; and
at least one fiber loop of a magneto-optical fiber wound around said at least one bus bar at a distance from said at least one bus bar for measuring electrical current through said bus bar;
a loop-shaped, flexible carrier strip carrying said fiber; and
a shield wall separate from said carrier strip and arranged between said carrier strip and said chamber.

2. The device of claim 1, wherein said enclosure comprises:
plural tube sections extending along an axial direction, wherein said shield wall is arranged axially between two of the tube sections.

3. The device of claim 2 wherein said tube sections and said shield wall are metallic, said device comprising:
a non-conductive seal arranged between at least one of said tube sections and said shield wall.

4. The device of claim 3, comprising:
a conductive part between said two tube sections for carrying a current between said tube sections, wherein said part is arranged radially outside of said fiber loop.

5. The device of claim 1, wherein said carrier strip is arranged in a recess formed at a radially outward facing side of said shield wall, said device comprising:
a lid closing said recess, is the lid being arranged radially outside said carrier strip.

6. The device of claim 1, comprising:
at least one partition insulator for dividing said chamber into partitions, wherein said partition insulator forms an electrically insulating partition wall axially separating two partitions and extending from said enclosure to said bus bar, said shield wall being arranged radially outside said partition wall.

7. The device of claim 6 wherein said shield wall is connected to said partition wall.

8. The device of claim 1, comprising:
a voltage sensor arranged at said shield wall.

9. The device of claim 8 wherein said voltage sensor is an electro-optical voltage sensor.

10. The device of claim 8, wherein said voltage sensor comprises:
a light guiding element or rod extending radially inwards from said shield wall.

11. The device of claim 10 wherein said light guiding element or rod is formed of a material whose refractive indices or birefringence change linearly under an applied electric field.

12. The device of claim 8, wherein said voltage sensor includes a light guiding element which extends at least from said shield wall to at least said bus bar, and wherein a radially outer end of said light guiding element extends into a recess in a radially inward facing surface of said shield wall and/or a radially inner end of said light guiding element extends into a recess in a radially outward facing surface of said bus bar.

13. The device of claim 11, wherein a radially outer and/or radially inner end of said light guiding element or rod carries a metal shielding electrically connected to the shield wall and/or to the bus bar.

14. The device of claim 10, wherein said light guiding element or rod extends through a radial bore in an insulating partition wall of said device, wherein said partition wall extends from said enclosure to said bus bar.

15. The device of claim 14
wherein said light guiding element or rod is embedded in resin or in oil in said radial bore, or
wherein said radial bore is in gas-exchange with said chamber, through a filter blocking at least part of $SF_6$ decomposition products.

16. The device of claim 8, wherein said voltage sensor comprises:
a light guiding element arranged at a radially inner side of said shield wall, and being looped at least once around said bus bar.

17. The device of claim 16 wherein said light guiding element is a transversally poled electro-optical fiber.

18. The device of claim 16, wherein said light guiding element is mounted on a mount comprising carbon fiber.

19. The device of claim 8, comprising:
an electro-optical sensing element having electrodes, wherein one of said electrodes is connected to an electrode ring arranged radially inside said shield wall and extending at least partially around said bus bar at a distance from said bus bar.

20. The device of claim 19 wherein said sensing element is arranged radially outside said shield wall and/or wherein a second of said electrodes is electrically connected to said enclosure.

* * * * *